(12) United States Patent
Le et al.

(10) Patent No.: US 7,729,111 B2
(45) Date of Patent: Jun. 1, 2010

(54) EXTERNAL HARD DRIVE HAVING INTEGRAL STAND

(75) Inventors: Trung V. Le, White Bear Township, MN (US); Peter Madson, Shanghai (CN); Lv Wang, Shanghai (CN)

(73) Assignee: Imation Corp., Oakdale, MN (US)

( * ) Notice: Subject to any disclaimer, the term of this patent is extended or adjusted under 35 U.S.C. 154(b) by 14 days.

(21) Appl. No.: 12/151,475

(22) Filed: May 7, 2008

(65) Prior Publication Data
US 2009/0279245 A1    Nov. 12, 2009

(51) Int. Cl.
*G06F 1/16* (2006.01)
(52) U.S. Cl. .............................. 361/679.33; 248/163.1; 710/304; 707/303
(58) Field of Classification Search ............... 248/163.1, 248/917; 710/303, 304; 707/303, 304; 361/679.33, 361/679.35, 679.36, 679.37, 679.39
See application file for complete search history.

(56) References Cited

U.S. PATENT DOCUMENTS

| 7,350,011 B2 * | 3/2008 | Keely et al. ................. 710/303 |
| 2003/0168558 A1 * | 9/2003 | Mallory et al. ........... 248/163.1 |
| 2009/0009953 A1 * | 1/2009 | Lin ............................. 361/685 |

* cited by examiner

*Primary Examiner*—Hung V Duong
(74) *Attorney, Agent, or Firm*—Shumaker & Sieffert, P.A.

(57) ABSTRACT

A hard drive includes an external hard drive and a stand integrally formed with the external hard drive. The external hard drive includes a housing maintaining a hard drive assembly configured to exchange data with a computer system, with the housing having opposing first and second major faces. The stand includes a first leg configured to project from the first major face of the housing and a second leg configured to project from the second major face of the housing.

10 Claims, 9 Drawing Sheets

EXTERNAL HARD DRIVE HAVING INTEGRAL STAND

BACKGROUND

Mass storage devices, such as hard drives, hard disk drives, and optical disk drives are widely employed for storing data, geographically porting the stored data, and backing up stored data from computer and other systems. Mass storage devices have become the preferred tool for backing up stored data and/or securing data across nearly all sectors of business and industry.

Recently, mass storage devices have been developed that are external to the system drive and are designed to exchange data with a computer system. These external mass storage devices are highly portable, and users are known to move the external storage devices between work stations, for example, when accessing network and system data. It is desirable to improve the portability and convenience of these mass storage devices without undesirably increasing the cost and complexity of the devices.

For these and other reasons, there is a need for the present invention.

SUMMARY

One aspect provides a hard drive including an external hard drive and a stand integrally formed with the external hard drive. The external hard drive includes a housing maintaining a hard drive assembly configured to exchange data with a computer system, with the housing having opposing first and second major faces. The stand includes a first leg configured to project from the first major face of the housing and a second leg configured to project from the second major face of the housing.

Another aspect provides a hard drive including an external hard drive and a support integrally formed with the external hard drive. The external hard drive includes a housing maintaining a hard drive assembly configured to exchange data with a computer system, with the housing having an edge extending between opposing first and second major faces. The support is movable relative to the external hard drive and configured to stand the external hard drive on its edge.

Another aspect provides a hard drive including an external hard drive and at least one leg that is durably attached to the external hard drive. The external hard drive includes a housing maintaining a hard drive assembly configured to exchange data with a computer system, with the housing having an edge extending between opposing first and second major faces. The leg is movable to a support position that stands the external hard drive on its edge in a substantially vertical position.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide an external hard disk drive having an integral mounting apparatus that allows the drive to be positioned or supported in a substantially vertical orientation. External hard drives are useful in that they may be ported from one area to the next. Users desire options and flexibility in positioning the external hard disk drive in their work area. Embodiments provide an external hard disk drive that can be balanced on its edge in a substantially vertical orientation in a stable manner.

In this specification, toroid means a surface generated by a closed curve rotating about, but not intersecting or containing, an axis in its own plane; or a solid having such a surface; or a body having such a surface (i.e., a body having the shape of a toroid).

In this specification, major face means a face of a three-dimensional object that has a greater area than another face (such as an edge) of that object, such that the major face is wider and/or longer than the edge. A major face has associated with it a major plane, but the major face need not be planar as it could include topography.

In this specification, edge means a side of a three-dimensional object, where an edge has a smaller area than a major face associated with the three-dimensional object.

In this specification, durably attached means attachment or connection between two components in a manner that the two components are not separable without damaging at least one of the components. For example, as described below, an external hard drive is provide including an external hard drive and at least one leg that is durably attached to the external hard drive in a manner that the leg is not separable from the external hard drive without damaging at least one of the leg or the external hard drive.

Figure 1:
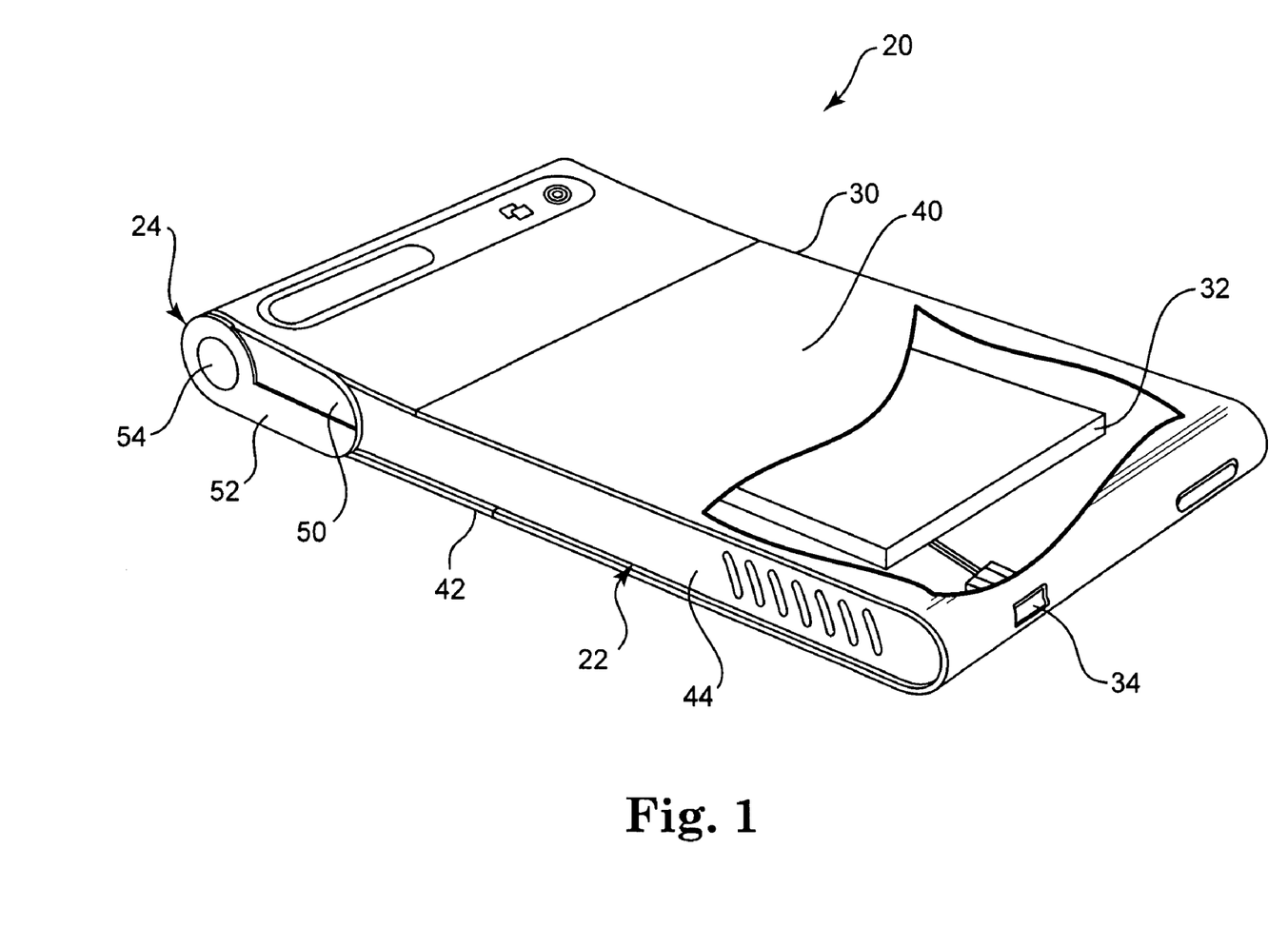
FIG. 1 is a perspective view of an external hard drive fabricated to include an integral stand according to one embodiment.

FIG. 1 is a perspective view of an external hard drive 20 according to one embodiment. External hard drive 20 includes an external hard drive 22 and a stand 24 integrally formed with external hard drive 22. In one embodiment, external hard drive 22 includes a housing 30 maintaining a hard drive assembly 32 that electrically communicates with a connection port 34. In another embodiment, hard drive assembly 32 communicates wirelessly with a data network. Hard drive assembly 32 is configured to backup data stored on a computer system and has a storage capacity of between about 250 gigabytes to about 1 terabyte, as of today, although it is reasonable to expect that the storage capacity will continue to increase. External hard drive 22 is performs all of the functions of an internal hard drive and is capable of executing programs, collecting data, saving data, communicating with an operating system of a computer, exchanging data with a computer system.

In one embodiment, external hard drive 22 is provided as an external hard disk drive having a "small" form factor of 2.5 inches. Other sizes for external hard drive 22 are also acceptable including "large" 3.5 inch form factor drives. Generally, external hard drive 22 can be ported and is provided in a wireless form, a wire connectable form, or other forms suitable for use as an external and portable hard drive.

Housing 30 encloses hard drive assembly 32 and includes a first major face 40 opposite a second major face 42 and an edge 44 extending between major faces 40, 42. In one embodiment, first major face 40 is provided in a first half of housing 30 and second major face 42 is provided in a second half of housing 30, where the two halves of housing 30 mate along a part line. Other configurations for assembling housing 30 are also acceptable. In one embodiment, housing 30 provides an exterior dimension of about 4.9 inches by 3.18 inches by 0.814 inches although other dimensions are also acceptable. Housing 30 is fabricated from a suitable material such as aluminum, plastic, thermo-formable plastic such as polyester, polyolefin, or acrylonitrile butadiene styrene (ABS). Other suitable housing materials are also acceptable.

Hard drive assembly 32 includes hard disk drive assemblies, solid state non-volatile memories such as an erasable programmable read only memory, electrically-erasable programmable read only memory, flash memory, or other suitable memory. In one embodiment, the memory within hard drive assembly 32 is a non-tape data storage medium providing random data storage access.

In one embodiment, hard drive assembly 32 is provided as a serial advanced technology attachment (SATA) 2.5 inch SATA hard drive that complies with Serial SATA International Organization standards for portable drives. For example, hard drive assembly 32 defines an XYZ form factor where X is about 3.94 inches, Y is about 2.75 inches, and Z is about 0.73 inches, such that the form factor of hard drive assembly 32 complies with the standardized size for 2.5 inch SATA hard drive assemblies. One such suitable hard drive assembly 32 includes a 2.5 inch SATA hard drive available from Fujitsu, Thailand, Model No. MHT2080BH, Part No. CA06500-B618. Other suitable hard drive assemblies are also acceptable, such as 3.5 inch form factor hard drives.

Connection port 34 is configured to enable data transfer into and out of external hard drive 20. In one embodiment, connector 34 provides a universal serial bus enterprise-class connector rated for up to one million insertions/connections with a computer system. Other connections include IEEE1394, eSATA, SAS, or FibreChannel interfaces.

In one embodiment, stand 24 is integrally formed and durably attached along edge 44 of external hard drive 22 and includes a first leg 50 movably connected to a second leg 52 about a pivot pin 54. Stand 24 is configured to fold/collapse along edge 44 for convenient portability of external hard drive 20. Stand 24 is movable to a deployed position away from edge 44 such that first leg 50 projects from first major face 40 and second leg 52 projects from second major face 42 to support external hard drive 20 in a standing configuration on edge 44.

Figure 2:
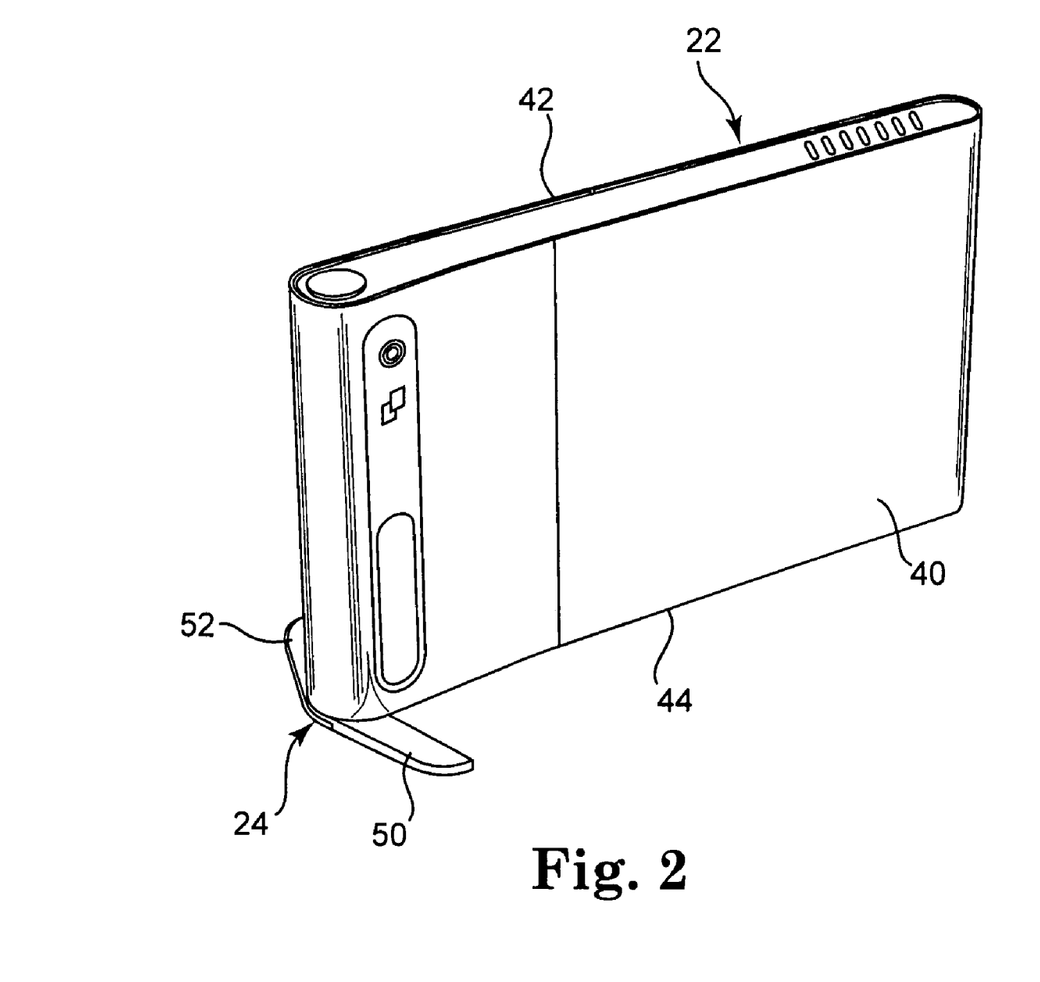
FIG. 2 is a perspective view of the external hard drive shown in FIG. 1 including the stand deployed to support the external hard drive on its edge in a substantially vertical position.

FIG. 2 is a perspective view of external hard drive 22 balanced in a stable configuration on edge 44. Stand 24 has been moved relative to edge 44 such that first leg 50 projects away from major face 40 and second leg 52 projects away from second major face 42. Legs 50, 52 support external hard drive 22 and enable external hard drive 22 to be balanced on edge 44 in a convenient and space saving manner when placed alongside a user's desktop computer, for example. Legs 50, 52 rotate relative to pivot pin 54 (FIG. 1).

In one embodiment, legs 50, 52 are manually deployed away from faces 40, 42, although legs 50, 52 could be spring loaded or actively/responsively deployed. In this manner, stand 24 provides a support that is moveable relative to external hard drive 22 and configured to stand external hard drive 22 on edge 44. Legs 50, 52 are durably attached to external hard drive 22 and are movable, although not separable, relative to edge 44.

Figure 3:
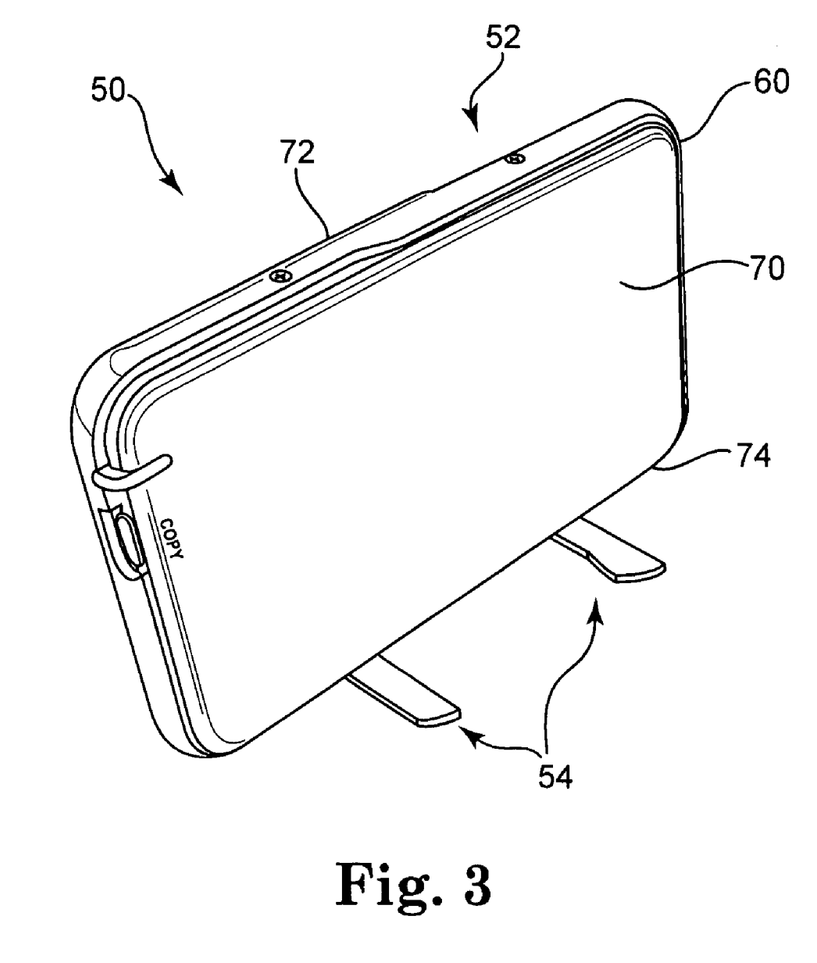
FIG. 3 is a perspective view of an external hard drive fabricated to include an integral stand according to another embodiment.

FIG. 3 is a perspective view of an external hard drive 50 according to another embodiment. External hard drive 50 includes an external hard drive 52 and a stand 54 or support 54 integrally formed with external hard drive 52. In one embodiment, external hard drive 52 includes a housing 60 having a first major face 70 opposite a second major face 72 and an edge 74 smoothly coupled between faces 70, 72. Stand 54 is durably attached to edge 74. Stand 54 is movable between a stowed position aligned with edge 74 and a deployed position projecting away from edge 74 in a manner that stand 54 supports external hard drive 52 in a substantially vertical manner on its edge 74. External hard drive 52 and housing 60 are substantially as described above and generally maintain a hard drive assembly that is suited to store up to about 1 terabyte of information and backup data stored on large computing systems.

Figure 4:
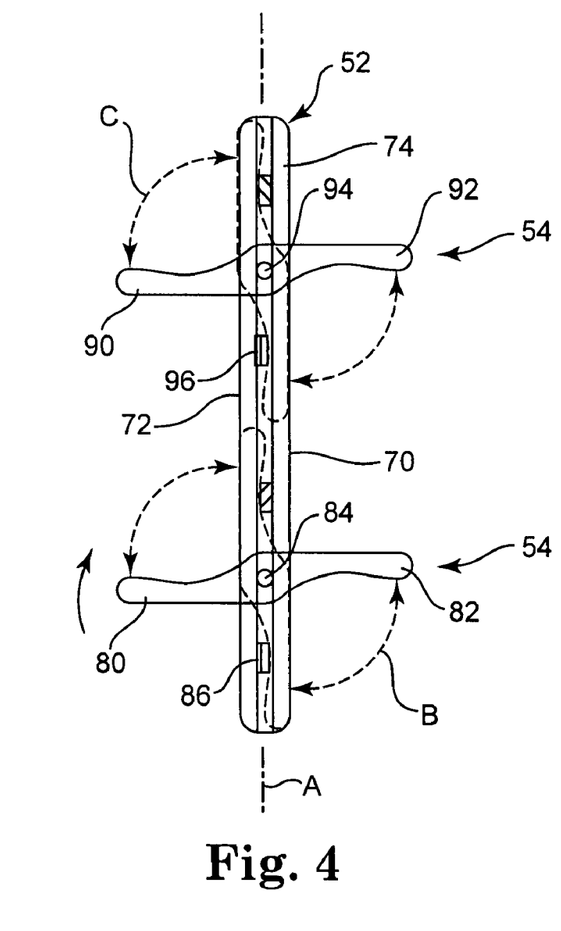
FIG. 4 is a bottom view of the external hard drive shown in FIG. 3 showing the stand deployed to a support position.

FIG. 4 is a plan view of edge 74 showing stand 54 integrally formed with and movably attached to external hard drive 52. In one embodiment, stand 54 includes a first leg 80 coupled to a second leg 82 around a pivot 84, and a third leg 90 coupled to a fourth leg 92 around a pivot 94. Legs 80, 82 rotate about pivot 84 and align with a longitudinal axis A when in a stowed position. Similarly, when in a stowed position, legs 90, 92 rotate around pivot 94 and align along longitudinal axis A.

When deployed, legs 80, 82 move relative to edge 74 through an arc B of between about 0-90 degrees, and legs 90, 92 move about pivot 94 through an arc C of between about 0-90 degrees. In one embodiment, one or more stops 86 are provided on edge 74 to stop movement of legs 80, 82, 90, 92 as they deploy to the open position (shown). When so deployed, legs 80, 90 project away from major face 72 at about right angles, and legs 82, 92 project away from major face 70 at about right angles. The deployed legs 80, 82, 90, 92 support external hard drive 52 such that external hard drive 52 stands on edge 74 as illustrated in FIG. 3 above.

Figure 5:
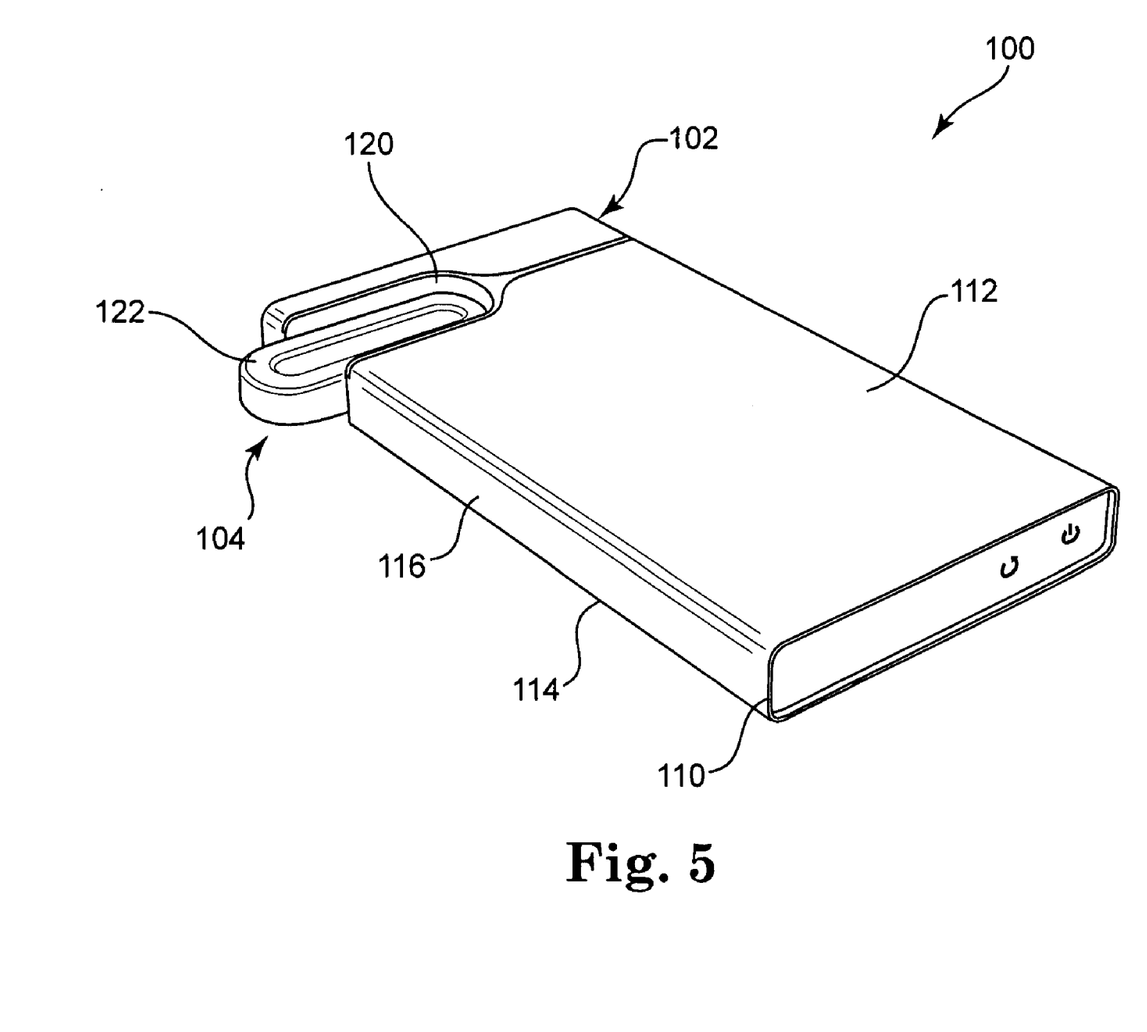
FIG. 5 is a perspective view of an external hard drive fabricated to include an integral stand according to another embodiment.

FIG. 5 is a perspective view of an external hard drive 100 according to another embodiment. External hard drive 100 includes an external hard drive 102 and a stand 104 integrally formed with external hard drive 102. External hard drive 102 includes a housing 110 maintaining a hard drive assembly (not shown but similar to hard drive assembly 32 of FIG. 1). Housing 110 includes a first major face 112 opposite a second major face 114 and an edge 116 extending between faces 112, 114. In one embodiment, stand 104 is defined by a keyhole 120 formed in edge 116 that extends between faces 112, 114 to support a key 122 that is pivotably coupled within keyhole 120.

In one embodiment, housing 110 has a part line 118 parting housing 110 into two sections that are configured to meet at part line 118 to capture key 122 within keyhole 120. In this manner, key 122 is durably attached to external hard drive 102. In one embodiment, key 122 includes trunnions configured to rotate within recesses formed in opposing walls of keyhole 120.

Keyhole 120 forms a void extending a portion of the way into housing 110. Electrical connectors and circuitry is wired internally within housing 110 around keyhole 120. Key 122 rotates within keyhole 120 between a stowed position in which key is parallel to faces 112, 114 and a deployed position in which key 122 is perpendicular to faces 112, 114. In one embodiment, key 122 provides a low inertia key having a rigid periphery surrounding an opening; key 122 is thus toroid-shaped.

Figure 6:
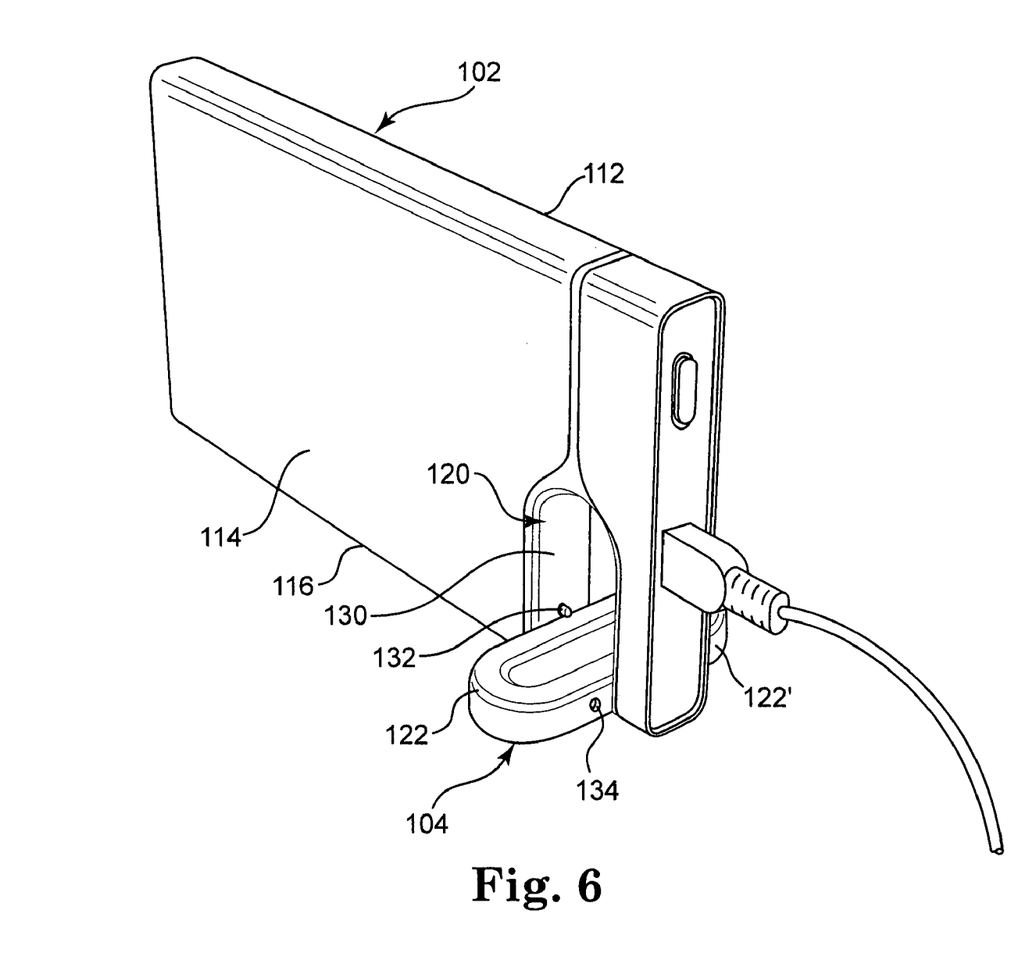
FIG. 6 is a perspective view of the external hard drive shown in FIG. 5 having the stand deployed to support the external hard drive in an upright position.

FIG. 6 is a perspective view of stand 104 deployed to support external hard drive 102 on edge 116. Key 122 has been rotated within keyhole 120 such that a first portion of key 122 projects away from face 114 and a second portion of key 122' projects away from face 112 to support external hard drive 102 in a stable, substantially vertical position on edge 116.

In one embodiment, a stop bead 132 is formed on an interior surface 130 of keyhole 120. Stop bead 132 is configured to stop key 122 in the deployed position. In one embodiment, stop bead 132 is a spring loaded bead that is free to extend away from surface 130 when key 122 is moved out of alignment with keyhole 120. When key 122 is inserted back into keyhole 120, stop bead 132 is compressed into surface 130 by key 122. In one embodiment, key 122 forms a recess 134 configured to capture and retain stop bead 132 when key 122 is stowed within keyhole 120.

Figure 7:
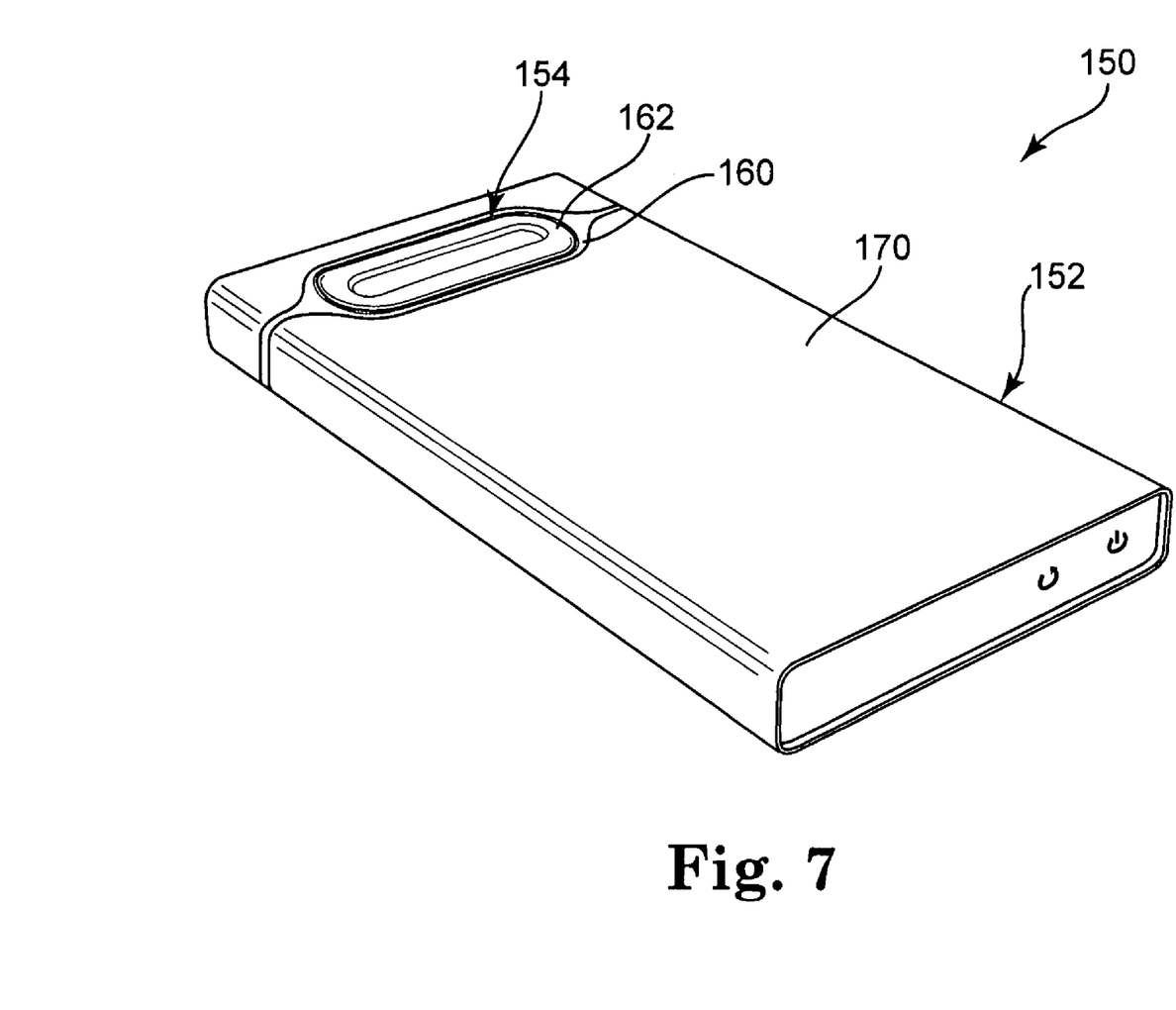
FIG. 7 is a perspective view of an external hard drive fabricated to include an integral stand according to another embodiment.

FIG. 7 is a perspective view of an external hard drive 150 according to another embodiment. External hard drive 150 includes an external hard drive 152 and a stand 154 integrally formed with external hard drive 152. External hard drive 152 is similar to external hard drive 102 (FIG. 5) and includes a housing maintaining a hard drive assembly as described above. Integrally formed stand 154 includes a keyhole 160 formed in housing 170 and a key 162 movably disposed within keyhole 160. In one embodiment, key 162 is mounted within keyhole 160 and configured to pivot between a stowed position as illustrated in FIG. 7 and a deployed position as illustrated in FIG. 8.

Figure 8:
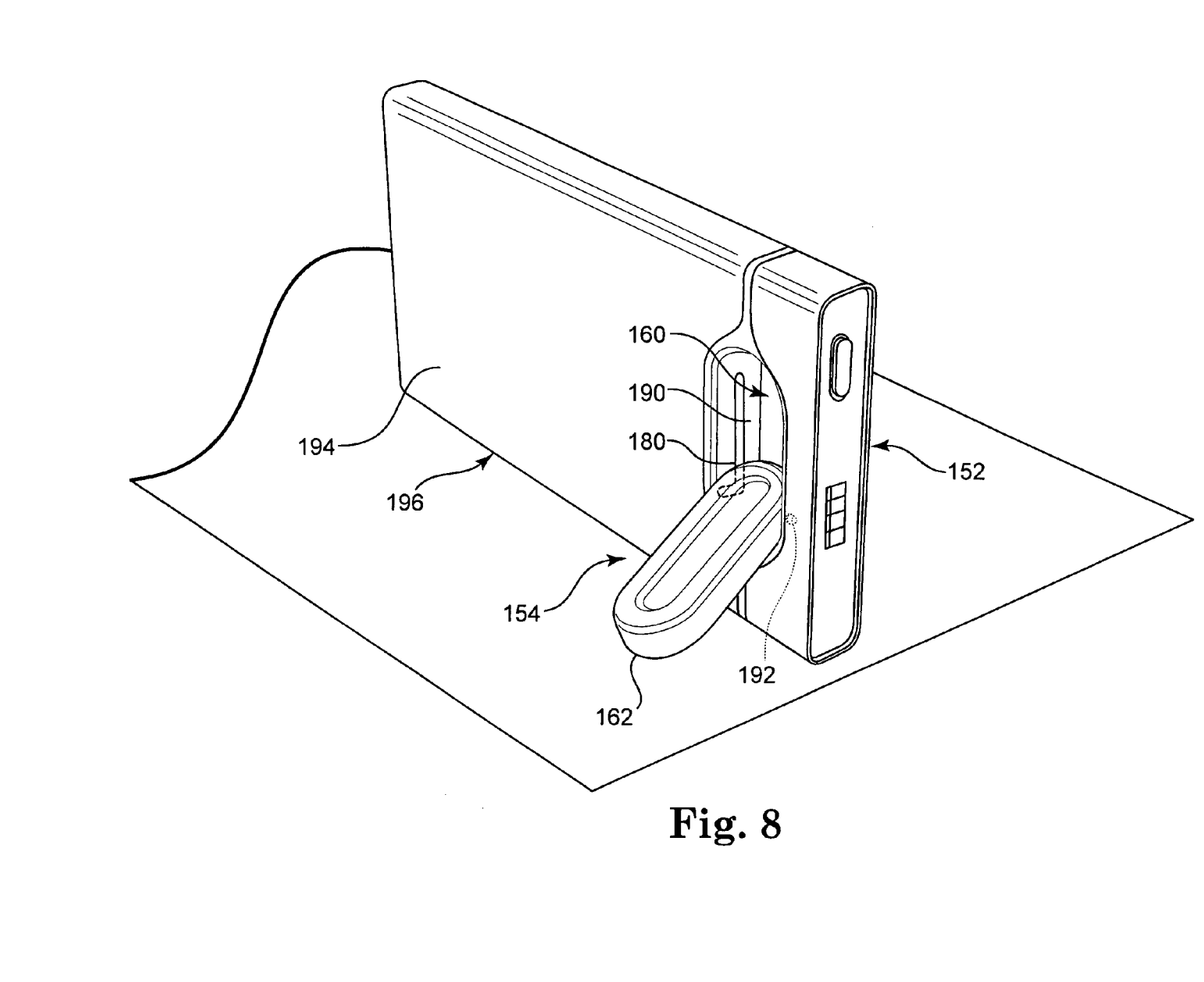
FIG. 8 is a perspective view of the external hard drive shown in FIG. 7 with the stand deployed to support the external hard drive in an upright position.

FIG. 8 is a perspective view of external hard drive 152 supported upright in a stable orientation on edge 174. A pivot channel 180 is formed in opposing walls 190 of housing 170. Key 162 is provided with trunnions 192 (one shown) that are captured within pivot channels 180. When deployed, key 162 is rotated out of keyhole 160 and trunnions 192 follow pivot channel 180 to enable key 162 to move into a deployed position. In the deployed position, key 162 projects away from major face 194 to support external hard drive 152 in a substantially vertical orientation on edge 196. To this end, key 162 pivots non-symmetrically within keyhole 160 such that a length of the leg portion touching the horizontal (table) surface is longer than a length of opposite leg portion.

Figure 9:
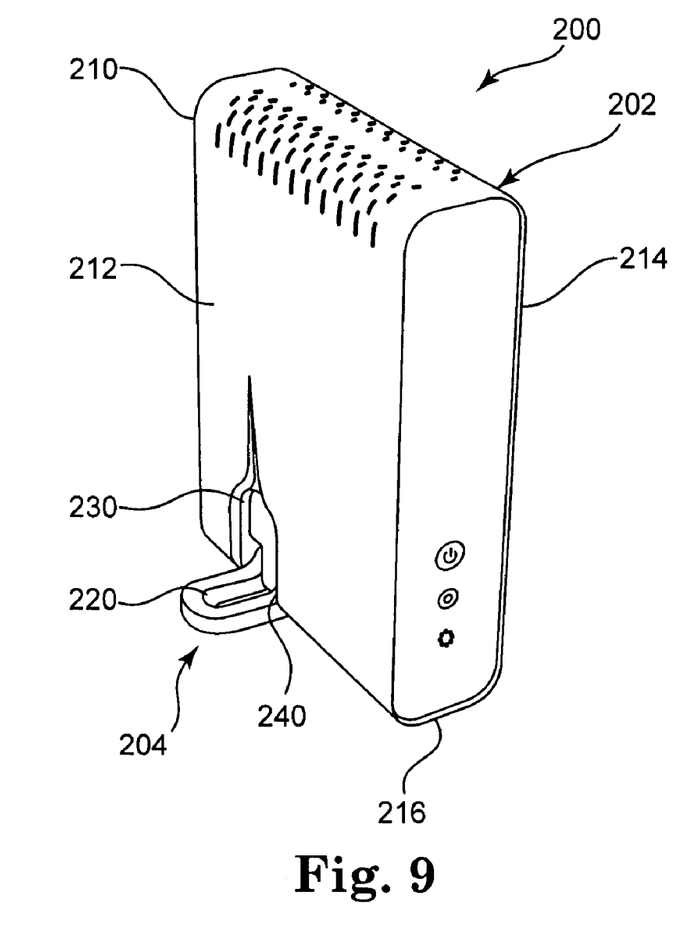
FIG. 9 is a perspective view of an external hard drive fabricated to include an integral stand according to another embodiment.

FIG. 9 is a perspective view of an external hard drive 200 according to another embodiment. External hard drive 200 includes an external hard drive 202 and a stand 204 integrally formed with external hard drive 202. In one embodiment, external hard drive 202 includes a housing 210 defining a first major face 212 opposite a second major face 214 and an edge 216 extending between faces 212, 214.

In one embodiment, stand 204 includes an opposing pair of legs 220 (one shown) that are integrally formed with housing 210. For example, in one embodiment first major face 212 defines a recess 230 sized to receive leg 220, and second major face 214 defines a similar recess sized to receive a leg similar to leg 220. In one embodiment, leg 220 is mounted on a pin 240 that enables leg 220 to pivot/rotate into and out of alignment with recess 230.

When leg 220 is stowed for transporting external hard drive 200, leg 220 is rotated about pin 240 and folded within recess 230 flat against face 212. In this configuration, external hard drive 200 provides a stowed form factor that is unchanged by the presence of stand 204. When deployed, leg 220 rotates out of recess 230 substantially orthogonal to first major face 212 into a support position. Leg 220 and the leg project from face 214 are configured to support external hard drive 202 in a stable configuration balanced on edge 216.

The embodiments taught above share a common feature in which the integral stands are not removable from their respective external hard drive without damaging the housing.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of external hard drives having integrated stands as discussed herein. Therefore, it is intended that this invention be limited only by the claims and the equivalents thereof.

What is claimed is:

1. A hard drive comprising:
   an external hard drive including a housing maintaining a hard drive assembly configured to exchange data with a computer system, the housing comprising opposing first and second major faces; and
   a stand integrally formed with the external hard drive, the stand comprising a first leg configured to project from the first major face of the housing and a second leg configured to project from the second major face of the housing, wherein the housing comprises an edge extending between the first and second major faces, the first and second legs are movably coupled to the edge of the housing, the first and second legs define a substantially straight and planar configuration, the first and second legs are co-planar with the edge between the first major face and the second major face when the first and second legs are not deployed, and the first and second legs extend away from the first major face and the second major face at approximately right angles when the first and second legs are deployed.

2. The hard drive of claim 1, wherein the stand comprises a retractable stand and the first leg is configured to scissors-fold against the second leg alongside the edge of the housing.

3. The hard drive of claim 2, wherein the edge of the housing defines a longitudinal axis, the first and second legs being orthogonal to the first and second major faces, and each of the first and second legs being movable relative to the longitudinal axis through an arc of between about 0-90 degrees.

4. The hard drive of claim 1, wherein the stand is not removable from the external hard drive without damaging the housing.

5. A hard drive comprising:
   an external hard drive including a housing maintaining a hard drive assembly configured to exchange data with a computer system, the housing comprising opposing first and second major faces; and
   a stand integrally formed with the external hard drive, the stand comprising a first leg configured to project from the first major face of the housing and a second leg configured to project from the second major face of the housing, wherein the housing comprises an edge extending between the opposing first and second major faces and a keyhole formed in the edge and extending between the first and second major faces, the stand comprising a key pivotably coupled within the keyhole, the key comprising the first and second legs.

6. The hard drive of claim 5, wherein the key comprises a low inertia toroid-shaped key.

7. The hard drive of claim 5, wherein the key comprises a retractable key that is stowable within the keyhole such that the first and second legs are parallel with the first and second major faces and deployable from the keyhole such that the first and second legs are orthogonal with the first and second major faces.

8. The hard drive of claim 5, wherein the key is pivotably coupled within the keyhole such that a length of the first leg is longer than a length of the second leg.

9. A hard drive comprising:
   an external hard drive including a housing maintaining a hard drive assembly configured to exchange data with a computer system, the housing comprising an edge extending between opposing first and second major faces; and
   a support integrally formed with the external hard drive, the support movable relative to the external hard drive and configured to stand the external hard drive on its edge, wherein the housing defines a keyhole formed in the edge extending between the first and second major faces, the support comprising a key pivotably coupled within the keyhole, the key comprising a first portion configured to project from the first major face of the housing and a second portion configured to project from the second major face of the housing.

10. A hard drive comprising:
    an external hard drive including a housing maintaining a hard drive assembly configured to exchange data with a computer system, the housing comprising an edge extending between opposing first and second major faces; and
    at least one leg that is durably attached to the external hard drive, the leg movable to a support position that stands the external hard drive on its edge in a substantially vertical position, wherein the at least one leg is pinned to the external hard drive and configured to swing out of a plane defined by one of the opposing first and second major faces and the at least one leg comprises a loop pinned in a keyhole formed in the edge of the housing.

* * * * *